United States Patent [19]

Ogawa et al.

[11] Patent Number: 4,968,524
[45] Date of Patent: Nov. 6, 1990

[54] PROCESS FOR PRODUCING A POLYACETYLENE

[75] Inventors: Kazufumi Ogawa, Hirakata; Hideharu Tamura, Katano; Norihisa Mino, Settsu, all of Japan

[73] Assignee: Matsushita Electric Industrial Co., Ltd., Kadoma, Japan

[21] Appl. No.: 256,619

[22] Filed: Oct. 12, 1988

[30] Foreign Application Priority Data

Oct. 16, 1987 [JP] Japan ............................ 62-262043
Dec. 7, 1987 [JP] Japan ............................ 62-309054

[51] Int. Cl.$^5$ ............................................ B05D 3/06
[52] U.S. Cl. .................................. 427/36; 427/541; 522/99; 522/142; 522/148; 522/149
[58] Field of Search .................... 427/35, 36, 54.1; 430/296, 270, 281, 288; 522/99, 142, 148, 149

[56] References Cited

U.S. PATENT DOCUMENTS 4,824,766  4/1989  Ogawa ............................ 430/299

FOREIGN PATENT DOCUMENTS 0003071  7/1979  European Pat. Off. .
0178606  4/1986  European Pat. Off. .
0184193  11/1986 European Pat. Off. .
2168622A 6/1986  United Kingdom .

OTHER PUBLICATIONS

Applied Physics Letters, vol. 49, No. 10, 8th Sep. 1986, pp. 599–601, American Institute of Physics, US; B. S. Elman et al.: "Ion Beam Irradiation of Langmuir–Blodgett Polydiacetylene Films".
Journal of American Chemical Society, vol. 105, No. 3, Mar. 1983, pp. 674–676, American, Chemical Society, US: L. Netzer et al.: "A New Approach to Construction of Artifical Monolayer Assemblies".

Primary Examiner—Stanley Silverman
Attorney, Agent, or Firm—Stevens, Davis, Miller & Mosher

[57] ABSTRACT

The present invention relates to an electric material, and particularly it relates to an organic substance having a polyacetylene linkage which exhibits electrical conductivity and nonlinear optical effect.

More particularly, the present invention provides a process for producing an organic substance having a polyacetylene linkage which can be utilized, for example, as an electric material, said process comprising immersing a substrate having a hydrophilic surface in a solution of a substance containing an acetylene (—C≡C—) group and a chlorosilane (—SiCl$_3$) group dissolved in a nonaqueous organic solvent, thereby subjecting the substance containing an acetylene group and a chlorosilane group to chemical adsorption on the surface of the substrate, subjecting said substance to polymerization reaction by the use of radiation such as X-rays, electron beams, γ-rays, or the like, and thereby producing a polyacetylene.

14 Claims, 5 Drawing Sheets

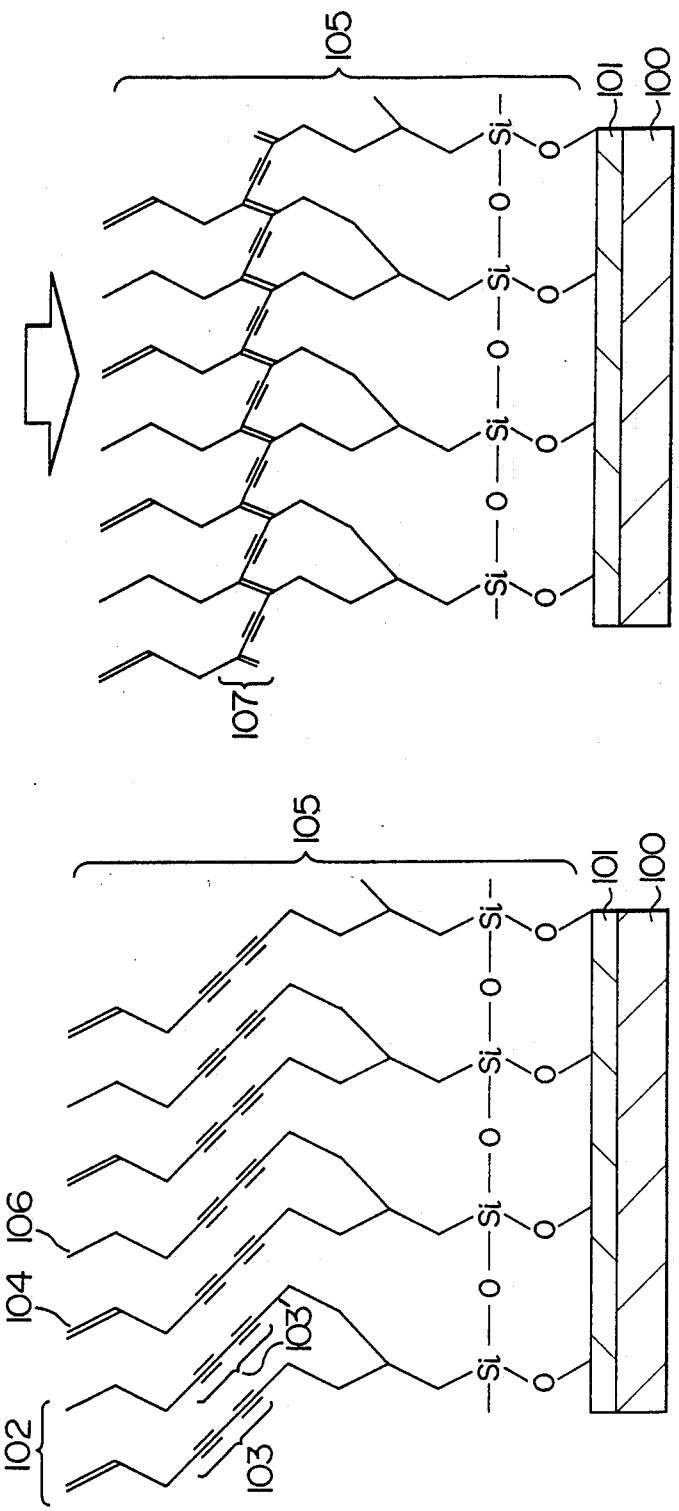

PROCESS FOR PRODUCING A POLYACETYLENE

BACKGROUND OF THE INVENTION

Polymers of acetylene derivatives have been extensively studied as optical and electronic functional materials because they have electrical conductivity and non-linear optical effect by virtue of the primary main chain having a $\pi$-electron conjugated system which is contained in the molecule of each polymer.

As a method for producing a polyacetylene, there is well known the polymerization method of Shirakawa et al. using a Ziegler-Natta catalyst.

On the other hand, it is well known that employment of an amphipatic acetylene derivative having both hydrophobic group and hydrophilic group permits formation of a monomolecular film on water surface and formation of a built-up film by the Langmuir-Blodgett (LB) technique. The LB technique is a method which in recent years, has been considered hopeful as one constructing means in development of molecular devices in which molecules themselves have functions. When the LB technique is employed, a monomolecular film of an acetylene derivative of several Ångströem order can be formed and a built-up film thereof can easily be obtained.

However, polyacetylene derivatives now known are unstable to heat, pressure, ultraviolet rays, etc. in an atmosphere containing oxygen, and therefore study of their stabilization is in progress.

But, no method for stabilizing an acetylene derivative polymer has been found.

BRIEF DESCRIPTION OF THE INVENTION

The present inventors found that a polyacetylene which is stable even in an atmosphere containing oxygen can be produced by immersing a substrate having a hydrophilic surface in a solution of a substance containing an acetylene (—C≡C—) group and a chlorosilane (—SiCl$_3$) group dissolved in a nonaqueous organic solvent, thereby subjecting the substance containing an acetylene (—C≡C—) group and a chlorosilane (—SiCl$_3$) group to chemical adsorption on the surface of the substrate, and polymerizing said substrate by the use of radiation such as X-rays, electron beams, $\gamma$-rays, etc. That is, the present inventors found that a straight-chain, ultra-high-molecular-weight (ultra-conjugater, high-molecular) polyacetylene can be produced by subjecting a monomolecular film of an acetylene derivative formed by a chemical adsorption method to radiation polymerization.

In other words, by immersing a substrate having a hydrophilic surface in a solution of a substance containing an acetylene (—C≡C—) group and a chlorosilane (—SiCl$_3$) group dissolved in a nonaqueous organic solvent and thereby subjecting the substance containing an acetylene (—C≡C—) group and a chlorosilane (—SiCl$_3$) group to chemical adsorption on the surface of substrate, a monomolecular film of the substance containing an acetylene (—C≡C—) group and a chlorosilane (—SiCl$_3$) group can be formed on the substrate in a state in which molecules of said substance are aligned. Furthermore, a straight-chain, ultra-high-molecular-weight polyacetylene having a continuous conjugated system can be produced by subjecting said monomolecular film to radiation polymerization by the use of X-ray, electron beams, $\gamma$-rays, etc.

Production of a polyacetylene merely by the use of the above-mentioned monomolecular film, in some cases, causes a structural distortion and hence becomes difficult. In detail, in order for a straight-chain hydrocarbon molecules to have a function therein, its reactive group is irradiated with some energy beams to be subjected to chemical reaction, but the terminal chlorosilane group of straight-chain hydrocarbon molecule constituting the monomolecular film contains an oxygen atom owing to the linkage —Si—O—Si—, and functional groups (acetylene groups) are too apart from each other to react with each other. Therefore, the reacting is insufficient. Moreover, even if the functional groups react to be bonded to each other, there is a large difference between the bond distance of the —Si—O—Si— at the end of straight-chain hydrocarbon molecule constituting the monomolecular film and the bond distance between the functional groups, so that a structural distortion is caused.

The process for producing a polyacetylene of the present invention is characterized by comprising a step of forming a monomolecular film by the use of a plurality of straight-chain hydrocarbon molecules which have one or more side chains, a chlorosilane group at one end of the main chain, and one or more acetylene groups between the carbon atoms of optional carbon-carbon bonds of the main chain and the side chain, as groups reactive to energy such as light, heat, electron ion, etc.; and a step of polymerizing the straight-chain hydrocarbon molecules by irradiating the reactive groups with energy beams such as light, heat, electron ion, etc. The process of the present invention is characterized by, comprising, in addition to the steps of the above production process, a step of forming a multilayer film by using straight-chain hydrocarbon molecules having an unsaturated group(s) at one or more ends other than the aforesaid end for chlorosilane group.

According to the process of the present invention, a monomolecular film is formed by using straight-chain hydrocarbon molecules having one or more side chains in optional positions of the molecules and reactive groups to impart a function in the main chain and the side chain, and then subjected to polymerization by irradiating the reactive groups with energy beams, and if necessary, the films subjected to polymerization are formed into a multilayer film, whereby there is solved the conventional problem that since the end of a straight-chain hydrocarbon molecular chain contains oxygen as shown by —Si—O—Si— and the straight-chain hydrocarbon molecule has no side chain, functional groups of the molecule are too apart to react with each other. Thus, the distance between the functional groups is reduced, so that their reactivity can be enhanced, and moreover occurrence of a structural distortion is reduced.

By virtue of the characteristics described above, conditions under which radiation polymerization reaction of an acetylene derivative monomer lasts without a break, can be maintained by irradiating molecules of the acetylene derivative aligned in monomolecular state, so that it becomes possible to produce a straight-chain, ultra-high-molecular-weight polyacetylene having a continuous conjugated system. Furthermore, since the polyacetylene produced has an ideal structure, the production process of this invention is very effective.

BRIEF DESCRIPTION OF THE DRAWINGS

FIGS. 4(a) and (b) are cross-sectional view for explaining a process for producing a polydiacetylene which is the third example of the present invention.

1 . . . substrate, 2 . . . monomolecular adsorption film, 3 . . . polyacetylene linkage, 11 . . . optional substrate, 12 . . . hydrophilic film (SiO$_2$ film), 13 . . . silane surfactant, 14, 14' . . . functional groups (acetyl groups), 15, 21 . . . vinyl groups, 16 . . . monomolecular film, 17 . . . methyl group, 18 . . . polyacetylene, 19 . . . electron beam, 20 . . . hydroxyl group, 100 . . . optional substrate, 101 . . . hydrophilic film (SiO$_2$ film), 102 . . . silane surfactant, 103, 103' . . . functional groups (diacetylene groups), 104 . . . vinyl group, 105 . . . monomolecular film, 106 . . . methyl group, 107 . . . polydiacetylene.

DETAILED DESCRIPTION OF THE INVENTION

The first example of the present invention is explained below.

Although various samples are used, an explanation is given by taking the case where there is used a silane surfactant [CH≡C—(CH$_2$)$_n$—SiCl$_3$ wherein n is an integer of preferably 10 to 20] which is one of acetylene derivatives.

For example, a silane surfactant [e.g., [CH≡C—(CH$_2$)$_{17}$—SiCl$_3$] is subjected to chemical adsorption on a Si substrate 1 having SiO$_2$ formed thereon. In this case, the —SiCl$_3$ group reacts with the —OH group formed together with SiO$_2$ on the surface of substrate, to cause dehydrochlorination, whereby a monomolecular film

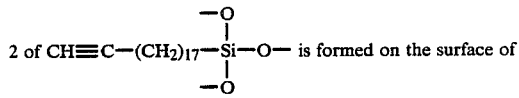

Figure 1A:
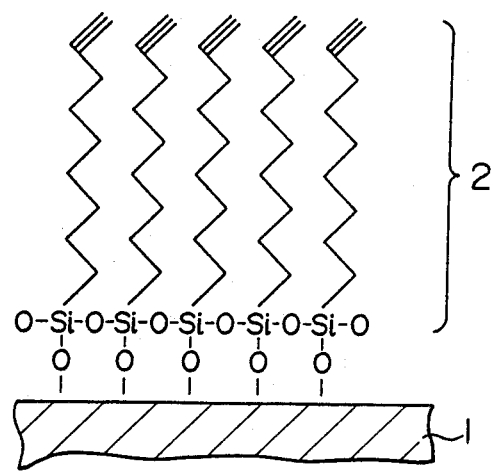
FIGS. 1(a) to 1(b) are a schematic flow diagram of a polyacetylene production procedure which is the first example of the present invention, and shows the concept of reaction in the polyacetylene production.

2 of CH≡C—(CH$_2$)$_{17}$—Si—O— is formed on the surface of substrate. For example, when a Si substrate having SiO$_2$ formed thereon is immersed in a solution prepared by dissolving the aforesaid silane surfactant in a mixture consisting of 80% n-hexane, 12% carbon tetrachloride and 8% chloroform to a concentration of 2.0×10$^{-3}$ to 5×10$^{-3}$ mole/l, at room temperature for several minutes, the bond —Si—O— can be formed in the SiO$_2$ surface [FIG. 1(a)]. It was confirmed by means of FTIR that the

Figure 2:
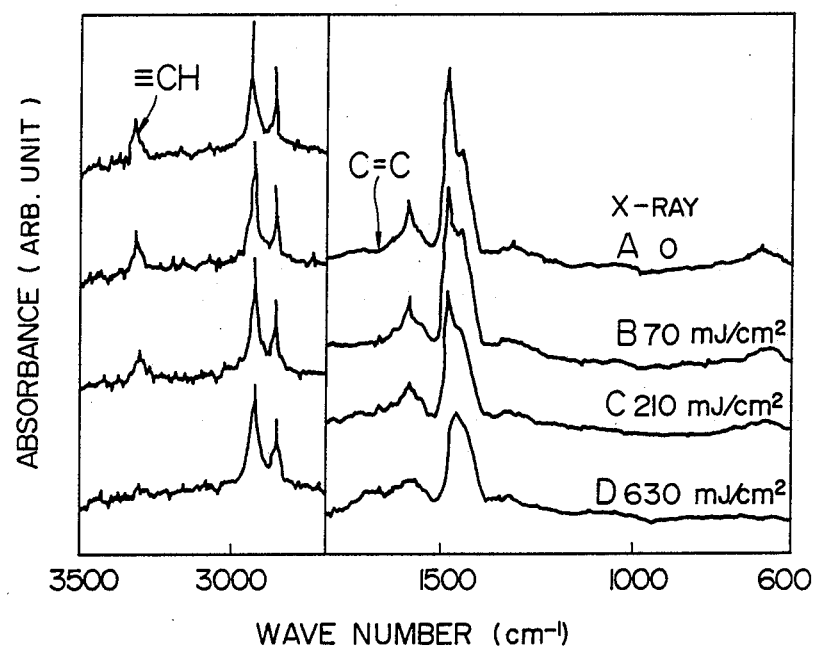
FIG. 2 show the results of analysis by means of a Fourier transform infrared spectrophotometer (FTIR) for confirming the process of polyacetylene formation accompanying X-ray irradiation.

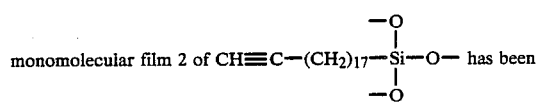

monomolecular film 2 of CH≡C—(CH$_2$)$_{17}$—Si—O— has been formed on the surface of substrate [FIG. 2, curve A].

Figure 1B:
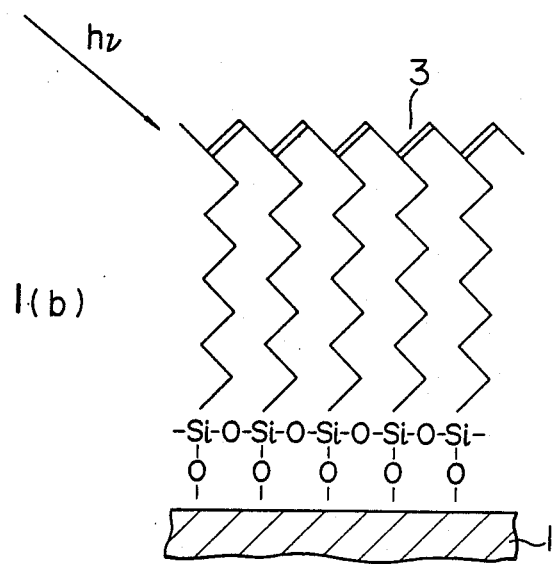

Subsequently, the whole surface of substrate is irradiated with radiation to cause radiation polymerization, whereby a polyacetylene linkage is formed [FIG. 1(b)]. As the radiation for the radiation polymerization, X-rays and electron beams are used. For confirming polymerization of the adsorption film, FTIR spectra are measured at various exposure doses.

In FIG. 2 is shown the change of FTIR spectra accompanying X-ray irradiation. As shown in curves A to D, owing to X-ray irradiation, the absorption at 3300 cm$^{-1}$ (due to ≡CH) decreases and the absorption at 1650 cm$^{-1}$ (due to C=C) increases in all the spectra. This fact proves that a polyacetylene having the linkage 3 (—CH=CH—)$_n$ (polyacetylene linkage) has been produced. That is, it has become apparent that the molecular alighment shown in FIG. 1(a) results in the reaction shown in FIG. 1(b), namely, production of a polyacetylene.

From the results described above, it is confirmed that on X-ray irradiation, the chemical adsorption film having an acetylene group gives a polyacetylene via the radiation polymerization process shown in FIG. 1.

On the other hand, even where electron beams with high energy (γ-rays have also the same effect) are used, the same reaction as described above is confirmed. The polyacetylene produced in the manner described above is very stable to heat, pressure, ultraviolet rays, etc. even in an atmosphere containing oxygen, as compared with polyacetylen conventionally produced by catalytic methods.

Although in the present example, an explanation is given only for a monomolecular film obtained by the use of the silane surfactant CH≡C—(CH$_2$)$_{17}$—SiCl$_3$ it will be apparent that the same method as described above is applicable to any substance which contains an acetylene (—C≡C—) group in the molecule and can be subjected to chemical adsorption, though the chemical structure of the polyacetylene produced is different depending on the substance used.

As the second example, a process for producing a polyacetylene is explained below, stepwise with reference to FIG. 3.

Numeral 11 shows an optional substrate (e.g., a Si substrate) for forming a polyacetylene. Numeral 12 shows a hydrophilic film (e.g., a SiO$_2$ film) formed on the optional substrate 1. Numeral 13 shows a silane surfactant of the formula:

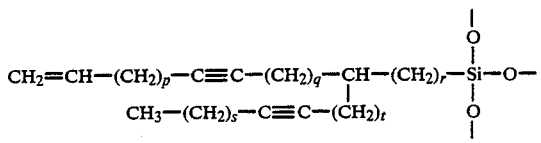

(wherein each of p, q, r, s and t is an optional integer), said silane surfactant constituting a monomolecular film 16 comprising straight—chain hydrocarbon molecules which have a side chain at the (r+1)th carbon atom from the Si atom, an acetylene group (—C≡C—) 14 as functional group at the (q+1)th carbon atoms of the main chain from said (r+1)th carbon atom, an acetylene group 14' at the (t+1)th carbon atom of the side chain from said (r+1)th carbon atom, and a vinyl group at the end of the main chain. In the straight-chain hydrocarbon molecule before formation of the monomolecular film, the terminal group on the Si side in the above chemical formula is a chlorosilane group (—SiCl₃). The linkage

is formed on the surface of the hydrophilic film (e.g., SiO₂ film) 12 by a monomolecular film forming method such as chemical adsorption method or Langmuir-Blodgett technique, whereby the monomolecular film 16 is formed. In this case, the straight-chain hydrocarbon molecules are formed into the film in a state in which the vinyl group ($CH_2=CH-$) 15 at the end of the molecule and the methyl group ($CH_3-$) 17 of the side chain are aligned on the surface of substrate (FIG. 3(a)).

In order to make the monomolecular film 16 functional, the film is irradiated with far ultraviolet rays to carry out the photoreaction of the acetylene groups in the main chain and the side chain with each other, whereby a polyacetylene $\{-(-CH=CH)_m-\}$ 18 having a conjugated system is produced. This polyacetylene has electrical conductivity and nonlinear optical effect, can be utilized as a photoelectronic functional material, and can be shaped in an optional direction on the same plane. In this case, since the density of acetylene groups is twice as high as before, the photoreactivity of the acetylene groups with each other for forming a polyacetylene is high, and since both the main chain and the side chain form a polyacetylene, the problem of structural distortion is solved (FIG. 3(b)).

Figure 3B:
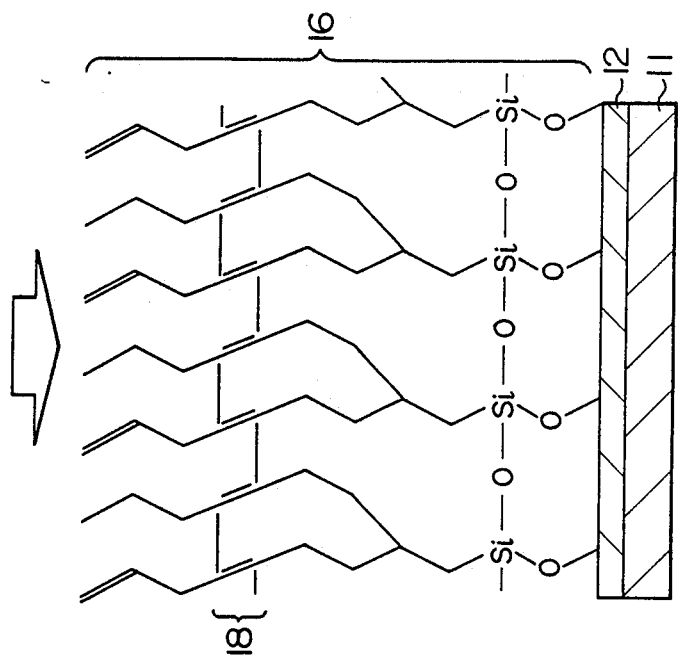
FIGS. 3(a) to (d) are cross-sectional views for explaining a process for producing a polyacetylene which is the second example of the present invention.
Figure 3A:
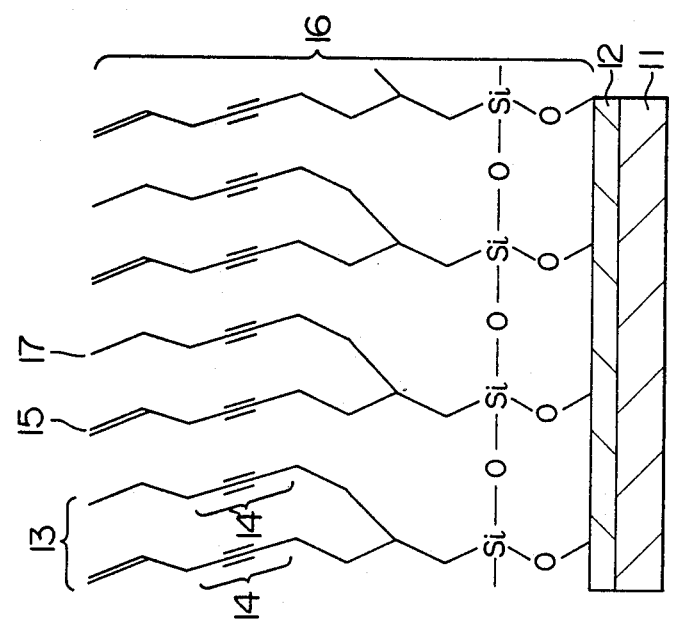
Figure 3D:
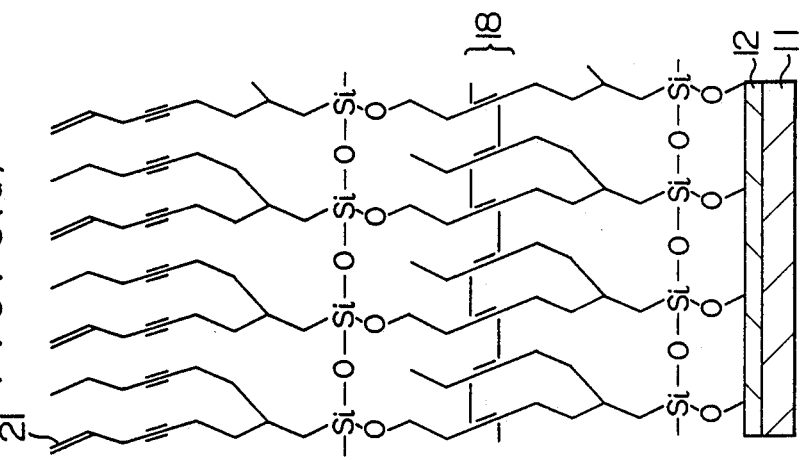
Figure 3C:
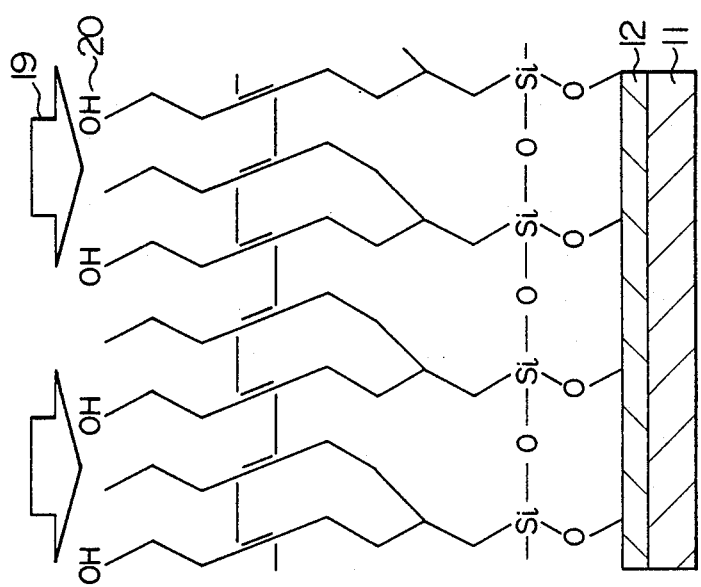

In order to further form polyacetylene on the monomolecular film 16, the film is irradiated in a water vapor atmosphere with energy beams, for example, electron beams converged to the molecular diameter order to activate the aforesaid vinyl group, whereby a hydroxyl group 20 is added thereto (FIG. 3(c)).

Subsequently, the same silane surfactant as the aforesaid surfactant 13, i.e.,

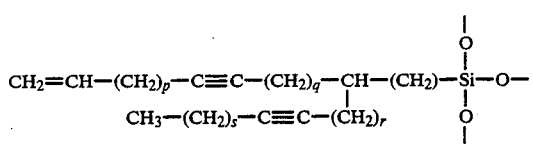

(wherein each of p, q, r, s and t is an optional integer) is added to the active group portion having a hydroxyl group added thereto, in the same manner as described above to form the linkage

In the thus formed film, vinyl groups 21 are aligned on the surface of the added molecule, a higher-order multilayer molecular structure is formed, namely, polyacetylene can be formed (FIG. 3(b)).

Although in the second example of the present invention, there is used the silane surfactant having one side chain of the formula:

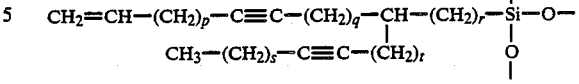

(wherein each p, q, r, s and t is an optional integer), the number of side chains may be increased if necessary.

Although far ultraviolet rays are used as energy beams in the second example of the present invention, radiation such as X-rays, electron beams, etc. may be used for the polymerization.

Although the terminal group of the side chain is a methyl group in the second example of the present invention, it may be replaced by a vinyl group.

Although a diacetylene group is shown as a functional group in the second example of the present invention, other functional groups such as pyrrole group, thienylene group, phenylene group, etc. may, of course, be employed.

Although an example of process for producing a polyacetylene is shown above, a polydiacetylene can easily be produced by a similar process.

As the third example, a process for producing a polydiacetylene is explained below stepwise with reference to FIG. 4.

Numeral 100 shows an optional substrate (e.g., a Si substrate) for producing a polydiacetylene. Numeral 101 shows a hydrophilic film (e.g., a SiO₂ film) formed on the optional substrate 100. Numeral 102 shows a silane surfactant of the formula:

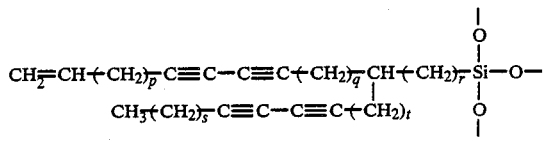

(wherein each of p, q, r, s and t is an optional integer), said surfactant constituting a monomolecular film 105 comprising straight—chain hydrocarbon molecules which have a side chain at the (r+1)th carbon atom from the Si atom, a diacetylene group ($-C\equiv C-C\equiv C-$) 103 as functional group at the (q+1)th carbon atom of the main chain from said (r+1)th carbon atom, a diacetylene group 103' at the (t+1)th carbon atom of the side chain from said (r+1)th carbon atom, and a vinyl group 104 at the end of the main chain. In the straight—chain hydrocarbon molecules before formation of the monomolecular film, the terminal group on the Si side in the above chemical formula is a chlorosilane group (—SiCl₃). The linkage

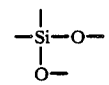

formed on the surface of the hydrophilic film (e.g., SiO₂ film) 101 by a monomolecular film forming method such as chemical adsorption method or Langmuir-Blodgett technique, whereby the monomolecular film 105 is formed. In this case, the straight-chain hydrocarbon molecules are formed into the film in a state in which the vinyl group ($CH_2=CH-$) 104 at the end of the molecule and the methyl group ($CH_3-$) 106 of the side chain are aligned on the surface of substrate (FIG. 4(a)).

In order to make the monomolecular film 105 functional, the film is irradiated with far ultravoilet rays to carry out the photoreaction of the acetylene groups in the main chain and the side chain with each other, whereby a polydiacetylene $\{-(-CH=CH-C\equiv C-)_m-\}$ 107 having a conjugated system is produced. This polydiacetylene has electrical conductivity, is expected to be utilized as a molecular wiring, and can be shaped in an optional direction on the same plane. In this case, since the density of diacetylene groups is twice as high as before, the photoreactivity of the diacetylene groups with each other for forming a polydiacetylene is high, and since both the main chain and the side chain form a polydiacetylene, the problem of structural distortion in a molecular structure constituting a polydiacetylene is solved.

A polyacetylene can be produced also according to the third example. In this case, the difference between processes for production of a polydiacetylene and a polyacetylene is due to the density of diacetylene groups in the main chain and the side chain of a straight-chain hydrocarbon molecule and the uprightness of the straight-chain hydrocarbon molecules. That is, when the density of diacetylene groups is high and the straight-chain hydrocarbon molecules are upright, a polyacetylene is formed, and when the molecules are in a relatively inclined state, a polydiacetylene is formed (FIG. 4(b)).

When further formation of polydiacetylene on the monomolecular film 105 is desired, a multilayer structure of polydiacetylene can be formed by the same manner as described in the second example.

In addition, it is obvious that in forming the multilayer structure, a functional portion such as polyacetylene, polydiacetylene or the like may be combined with each layer.

What is claimed is:

1. A process for producing a polyacetylene which comprises
    a step of immersing a substrate having a hydrophilic surface in a solution of a substance having a chlorosilane group and a group(s) reactive to energy beams dissolved in a nonaqueous organic solvent, and thereby subjecting the substance having a hydrophilic group and the reactive group(s) to chemical adsorption on the surface of the substrate, and
    a step of polymerizing said substance by irradiation with energy beams.

2. A process for producing a polyacetylene according to claim 1, wherein said reactive groups(s) constituting the substance having a chlorosilane group and a group reactive to energy beams is an acetylene group.

3. A process for producing a polyacetylene according to claim 1, wherein said energy beams are ultraviolet rays, far ultraviolet rays, electron ion beams, X-rays, γ-rays, etc.

4. A process for producing a polyacetylene according to claim 1, wherein molecule of said substance having a chlorosilane group and a group(s) reactive to energy beams is a straight-chain hydrocarbon molecule.

5. A process for producing a polyacetylene according to claim 4, wherein the number of carbon atoms constituting said straight-chain hydrocarbon molecule is 10 or more.

6. A process for producing a polyacetylene according to claim 4, wherein said chlorosilane group is at the end of the straight-chain hydrocarbon molecule.

7. A process for producing a polyacetylene according to claim 4, wherein said group(s) reactive to energy beams is at an optional position in the straight-chain hydrocarbon molecule.

8. A process for producing a polyacetylene according to claim 4, wherein said straight-chain hydrocarbon molecule has one or more groups reactive to the energy beams.

9. A process for producing a polyacetylene according to claim 4, wherein the terminal group other than the terminal chlorosilane group of said straight-chain hydrocarbon molecule is an unsaturated group.

10. A process for producing a polyacetylene according to claim 9, wherein a multilayer film is formed using the straight-chain hydrocarbon molecules having the unsaturated group.

11. A process for producing a polyacetylene according to claim 9, wherein said unsaturated group is a vinyl group.

12. A process for producing a polyacetylene according to claim 4, wherein said straight-chain hydrocarbon molecule has one or more side chains.

13. A process for producing a polyacetylene according to claim 12, wherein the chlorosilane group is at the end of main chain of the straight-chain hydrocarbon molecule having a side chain(s).

14. A process for producing a polyacetylene according to claim 12, wherein the groups reactive to energy beams are present in the main chain and the side chain of the straight-chain hydrocarbon molecule having a side chain(s).

* * * * *